United States Patent
Chou et al.

(10) Patent No.: US 8,476,100 B2
(45) Date of Patent: Jul. 2, 2013

(54) METHOD OF FORMING THIN FILM SOLAR CELL AND STRUCTURE THEREOF

(75) Inventors: Kuang-Ting Chou, Hsin-Chu (TW); Han-Tang Chou, Hsin-Chu (TW); Ming-Yuan Huang, Hsin-Chu (TW); Han-Tu Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 477 days.

(21) Appl. No.: 12/731,152

(22) Filed: Mar. 25, 2010

(65) Prior Publication Data

US 2011/0155234 A1 Jun. 30, 2011

(30) Foreign Application Priority Data

Dec. 24, 2009 (TW) ................................ 98144713 A

(51) Int. Cl.
*H01L 21/00* (2006.01)
(52) U.S. Cl.
USPC ........... 438/72; 438/73; 438/96; 257/E21.211
(58) Field of Classification Search
USPC .................................................. 257/E21.211
See application file for complete search history.

(56) References Cited

U.S. PATENT DOCUMENTS

| | | | |
|---|---|---|---|
| 2007/0227578 A1 | 10/2007 | Perozziello | |
| 2008/0135812 A1 | 6/2008 | Yu | |
| 2009/0014693 A1 | 1/2009 | Zahn | |
| 2009/0277499 A1 | 11/2009 | Aoki | |
| 2010/0078064 A1* | 4/2010 | Coakley | 136/246 |
| 2010/0159633 A1* | 6/2010 | Lee et al. | 438/88 |
| 2010/0197072 A1* | 8/2010 | Kim et al. | 438/72 |
| 2010/0252109 A1 | 10/2010 | Hong | |

FOREIGN PATENT DOCUMENTS

| | | |
|---|---|---|
| CN | 101313411 A | 11/2008 |
| CN | 101504960 A | 8/2009 |
| TW | 200847451 | 12/2008 |
| TW | 200906897 | 2/2009 |
| TW | 200924211 | 6/2009 |

OTHER PUBLICATIONS

Aoki et al., English Machine Translated of JP Publication No. 2007-109842, Apr. 26, 2007; (Machine Translated Sep. 26, 2012).*

* cited by examiner

*Primary Examiner* — Mohsen Ahmadi
(74) *Attorney, Agent, or Firm* — Winston Hsu; Scott Margo

(57) ABSTRACT

A method of forming thin film solar cell includes the following steps. A substrate is provided, and a plurality of first electrodes are formed on the substrate. A printing process is performed to print a light-absorbing material on the substrate and the first electrodes to form a plurality of light-absorbing patterns. Each of the light-absorbing patterns corresponds to two adjacent first electrodes, partially covers the two adjacent first electrodes, and partially exposes the two adjacent first electrodes. A plurality of second electrodes are formed on the light-absorbing patterns.

12 Claims, 6 Drawing Sheets

METHOD OF FORMING THIN FILM SOLAR CELL AND STRUCTURE THEREOF

BACKGROUND OF THE INVENTION

1. Field of the Invention

The present invention relates to a method of forming a thin film solar cell and a structure thereof, and more particularly to a method and a structure thereof in which light-absorbing patterns are formed by printing process.

2. Description of the Prior Art

The primary energy source for human beings comes from petroleum, but the amount of petroleum resource is known to be limited. Therefore, the dependences on alternative energy nowadays are getting stronger. Among all of the alternative energies, solar power shows the most promising potential.

The manufacturing of solar cells can be classified into semiconductor processed solar cells and thin film processed solar cells. The solar cells fabricated using a semiconductor process use semiconductor substrates, e.g. silicon substrates, and the semiconductor process uses techniques such as doping and diffusion to form light-absorbing layers of the solar cells. The solar cells fabricated using a thin film process, on the other hand, use plastic or glass substrates, and the thin film process uses thin film technology to form light-absorbing layers of the solar cells. Due to the high demand of pure silicon in the semiconductor industry, the raw material for fabricating the solar cells using the semiconductor process faces shortage; therefore, solar cells fabricated using the thin film process have become the mainstream product on the market.

The light-absorbing layer of the conventional thin film solar cell is formed by deposition process, and the light-absorbing layer is patterned by photolithography process. However, the photolithography process possesses high cost, leading the cost of the conventional thin film solar cells to be expensive, thereby adding up the overall cost of the thin film solar cell.

SUMMARY OF THE INVENTION

It is one objective of the present invention to provide a method of forming a thin film solar cell and a structure thereof, for reducing the manufacturing cost of the thin film solar cell.

According to a preferred embodiment of the present invention, the method of forming the thin film solar cell includes the following steps. A substrate is provided, and a plurality of first electrodes are formed on the substrate. A printing process is performed to print a light-absorbing material on the substrate and the first electrodes to form a plurality of light-absorbing patterns. Each of the light-absorbing patterns corresponds to two adjacent first electrodes respectively, partially covers the two adjacent first electrodes, and partially exposes the two corresponding adjacent first electrodes. A plurality of second electrodes are formed on the light-absorbing patterns.

A preferred embodiment in accordance to the present invention further provides a thin film solar cell. The thin film solar cell includes a substrate, a plurality of first electrodes, a plurality light-absorbing patterns, a buffer layer and a plurality of second electrodes. The first electrodes are disposed on the substrate. The light-absorbing patterns are disposed on the substrate and the first electrodes. Each of the light-absorbing patterns corresponds to two adjacent first electrodes respectively, partially covers the two adjacent first electrodes, and partially exposes the two adjacent first electrodes. The buffer layer is disposed on the light-absorbing patterns, and the buffer layer is electrically connected to the first electrodes exposed by the light-absorbing patterns. The second electrodes are disposed on the buffer layer.

The method of forming the thin film solar cell in accordance to the present invention utilizes printing processes to form the light-absorbing patterns, so that the manufacturing cost in comparison to conventional method which uses a photolithography process, is greatly reduced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
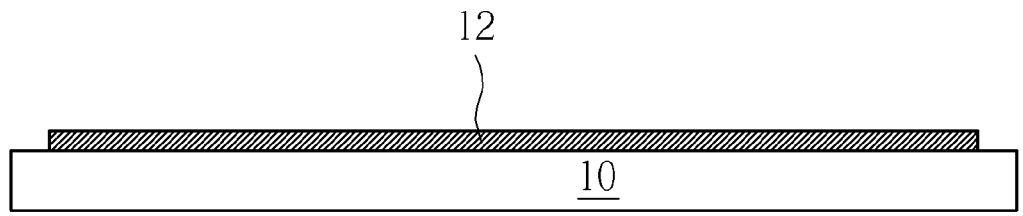
FIG. 1 to FIG. 6 are schematic diagrams illustrating a method of forming a thin film solar cell in accordance to a first preferred embodiment of the present invention.

Referring to FIG. 1 to FIG. 6, FIG. 1 to FIG. 6 are schematic diagrams illustrating a method of forming a thin film solar cell in accordance to a first preferred embodiment of the present invention. As illustrated in FIG. 1, a substrate 10 is first provided. The substrate 10 can be a plastic substrate, a glass substrate or other types of substrate made of any materials. A conductive layer 12 is then formed on the substrate 10. The conductive layer 12 can be made of any materials of excellent electrical conductivity, e.g. metallic materials or transparent conductive materials. The light-receiving surface of the thin film solar cell in accordance to the present embodiment is the top side surface of FIG. 1; therefore, the conductive layer 12 should be made of a metallic material which exhibits both excellent electrical conductivity and light reflectivity, e.g. molybdenum, but the material is not limited.

Figure 2:
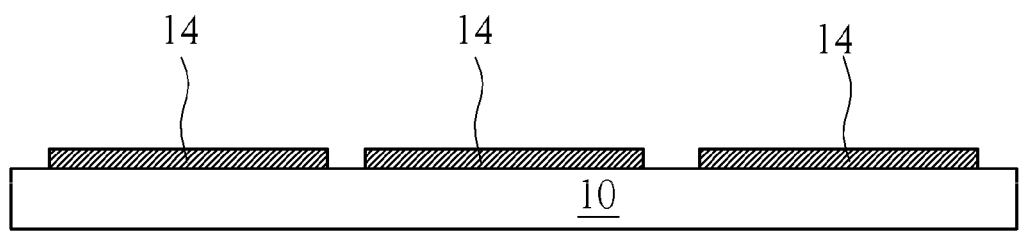

As illustrated in FIG. 2, the conductive layer 12 is then patterned to form a plurality of first electrodes 14 on the substrate 10. The step of patterning the first electrodes 14 in accordance to the present embodiment is preferably achieved by a laser scribing process, but is not limited. For example, the step of patterning the first electrodes 14 can also be achieved by a mechanical scribing process or a photolithography process.

Figure 3:
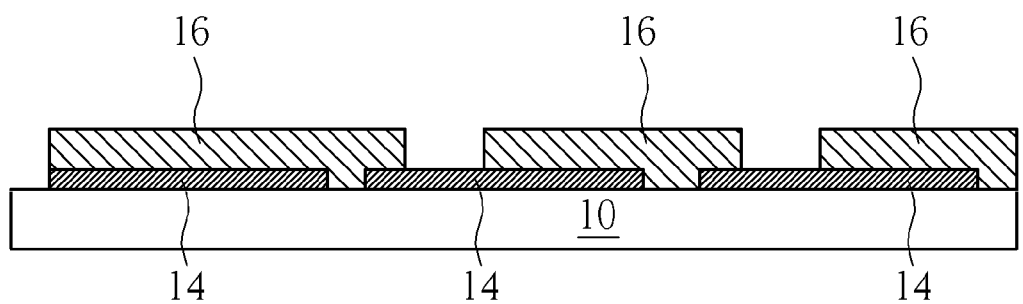

As illustrated in FIG. 3, a printing process is subsequently performed to print a light-absorbing material on the substrate 10 and the first electrodes 14, so as to form a plurality of light-absorbing patterns 16. Each of the light-absorbing patterns 16 substantially corresponds to the first electrodes 14, and each of the light-absorbing patterns 16 partially exposes the corresponding first electrodes 14. To be exact, each of the light-absorbing patterns 16 partially covers two corresponding adjacent first electrodes 14 substantially, partially exposes the two corresponding adjacent first electrodes 14, and completely covers the substrate 10 between the two corresponding adjacent first electrodes 14. The printing process in accordance to the present invention can be an ink-jet printing process, a screen printing process or other kinds of printing processes. The light-absorbing material in accordance to the present embodiment includes solution-based light-absorbing materials, but is not limited. For example, the light-absorbing material can be made of a group I B, group III A and group VI A compound semiconductor (I-III-VI compound semiconductor), a group II B and group VI A compound semiconductor (II-VI compound semiconductor) or other light-absorbing materials. If the light-absorbing material is made of a group I B, group III A and group VI A compound semiconductor, the light-absorbing material may include copper-indium-gallium-selenium (CIGS), copper-indium-selenium (CIS), copper-indium-gallium-sulfur-selenium (CIGSSe), copper-gallium-selenium (CGS) or other group I B, group III A and group VI A compound semiconductors, or combinations thereof. If the light-absorbing material is made of a group II B and group VI A compound semiconductor, the light-absorbing material may include cadmium-telluride (CdTe) or other group II B and group VI A compound semiconductors, or combinations thereof.

Figure 4:
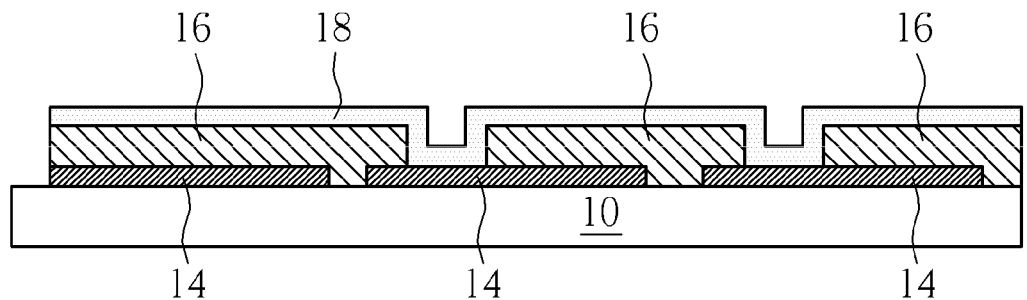

As illustrated in FIG. 4, a buffer layer 18 is then formed on the light-absorbing patterns 16. The buffer layer 18 contacts the first electrodes 14 exposed by the light-absorbing patterns 16, and the buffer layer 18 is electrically connected to the first electrodes 14 exposed by the light-absorbing patterns 16. The buffer layer 18 can be made of cadmium sulfide (CdS), zinc sulfide (ZnS), di-indium tri-sulfide ($In_2S_3$), mixtures of indium oxide, indium hydroxide and indium sulfide (In(O, OH,S)), zinc oxide (ZnO), zinc selenide (ZnSe), mixtures of zinc oxide, zinc hydroxide and zinc sulfide (Zn(O,OH,S)), zinc magnesium oxide (ZnMgO), di-indium tri-selenide ($In_2Se_3$), mixtures of indium oxide, indium hydroxide and indium selenide (In(O,OH,Se)), indium tri-hydroxide (In(OH)$_3$), zinc indium selenide (ZnInSe), tin oxide (SnO), tin disulfide ($SnS_2$) or other buffer materials, or combinations thereof.

Figure 5:
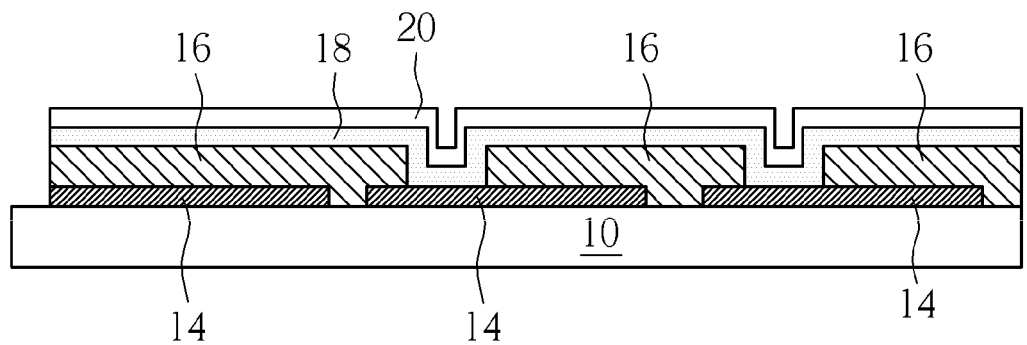

As illustrated in FIG. 5, a transparent conductive layer 20 is then formed on the buffer layer 18. The transparent conductive layer 20 in accordance to the present embodiment can be any transparent conductive materials of excellent electrically conductivity, e.g. undoped zinc oxide (i-ZnO), aluminum doped zinc oxide (AZO) or other transparent conductive materials, or combinations thereof.

Figure 6:
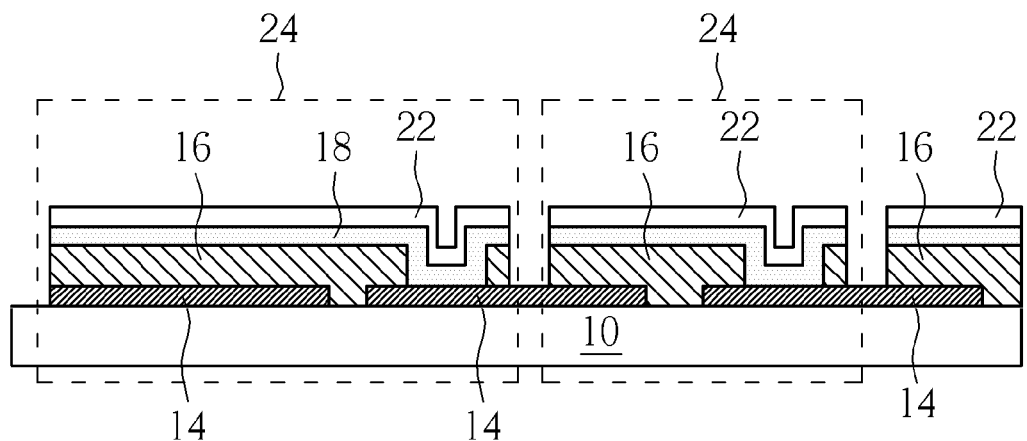

As illustrated in FIG. 6, the transparent conductive layer 20 is then patterned to form a plurality of second electrodes 22. The step of patterning the transparent conductive layer 20 in accordance to the present embodiment is preferably achieved by a mechanical scribing process or a laser scribing process. Also, the buffer layer 18 and the light-absorbing patterns 16 may be trimmed off during the mechanical scribing process or the laser scribing process in order to form a plurality of thin film solar cell units 24 electrically connected in series. The method in accordance to the present invention is not limited. For instance, the transparent conductive layer 20 may be patterned by a photolithography process to form the second electrodes 22, and the buffer layer 18 and the light-absorbing patterns 16 which are not covered by the second electrodes 22, are further removed by an etching process using the second electrodes 22 as a shielding mask to form the thin film solar cell units 24 electrically connected in series.

Figure 7:
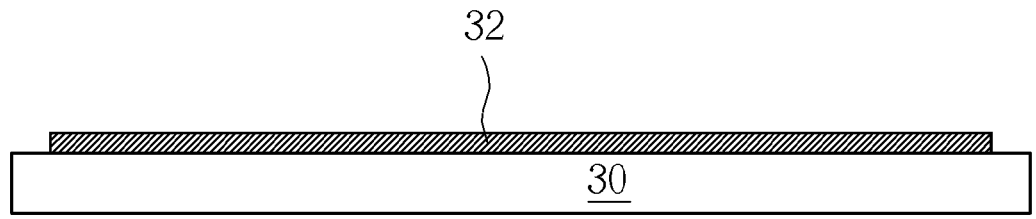
FIG. 7 to FIG. 12 are schematic diagrams illustrating a method of forming a thin film solar cell in accordance to a second preferred embodiment of the present invention.

Referring to FIG. 7 to FIG. 12, FIG. 7 to FIG. 12 are schematic diagrams illustrating a method of forming a thin film solar cell in accordance to a second preferred embodiment of the present invention. As illustrated in FIG. 7, a substrate 30 is first provided. The substrate 30 can be a plastic substrate, a glass substrate or other types of substrate made of any materials. A conductive layer 32 is then formed on the substrate 30. The conductive layer 32 can be made of any materials of excellent electrical conductivity, e.g. metallic materials or transparent conductive materials. The light-receiving surface of the thin film solar cell in accordance to the present embodiment is the top side surface of FIG. 7; therefore, the conductive layer 32 should be made of a metallic material which exhibits both excellent electrical conductivity and light reflectivity, e.g. molybdenum, but the material is not limited.

Figure 8:
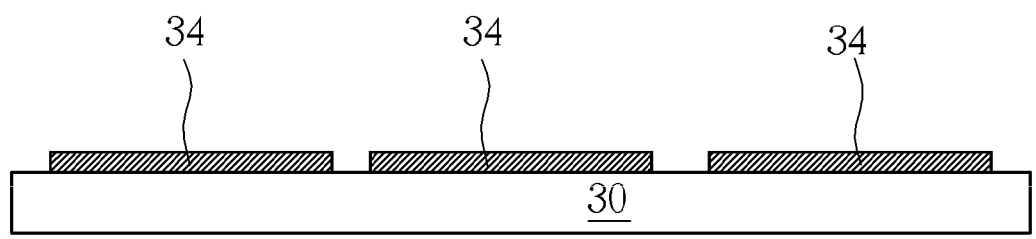

As illustrated in FIG. 8, the conductive layer 32 is then patterned for form a plurality of first electrodes 34 on the substrate 30. The step of patterning the first electrodes 34 in accordance to the present embodiment is preferably achieved by a laser scribing process, but is not limited. For example, the step of patterning the first electrodes 34 can also be achieved by a mechanical scribing process or a photolithography process.

Figure 9:
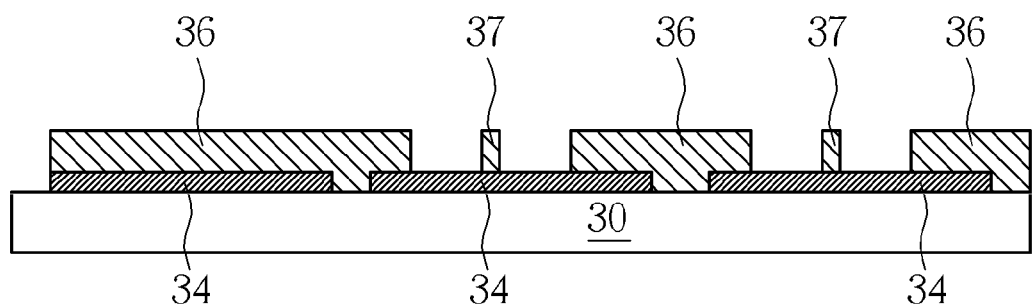

As illustrated in FIG. 9, a printing process is subsequently performed to print a light-absorbing material on the substrate 30 and the first electrodes 34, so as to form a plurality of light-absorbing patterns 36 and a plurality of spacing structures 37, where the spacing structures 37 are disconnected from the light-absorbing patterns 36. Each of the light-absorbing patterns 36 corresponds to the first electrodes 34 respectively, and each of the light-absorbing patterns 36 partially exposes the corresponding first electrodes 34. To be exact, each of the light-absorbing patterns 36 partially covers the two corresponding adjacent first electrodes 34 substantially, partially exposes the two corresponding adjacent first electrodes 34, and completely covers the substrate 30 between the two corresponding adjacent first electrodes 34. Furthermore, each of the spacing structures 37 is disposed on one of the first electrodes 34 between two adjacent light-absorbing patterns 36, and each of the spacing structures 37 is disconnected from the light-absorbing patterns 36. The printing process in accordance with the present invention can be an ink-jet printing process, a screen printing process or other kinds of printing processes. The light-absorbing material in accordance to the present embodiment includes solution-based light-absorbing materials, but is not limited. For example, the light-absorbing material can be made of a group I B, group III A and group VI A compound semiconductor, a group II B and group VI A compound semiconductor or other light-absorbing materials. If the light-absorbing material is made of a group I B, group III A and group VI A compound semiconductor, the light-absorbing material may include copper-indium-gallium-selenium (CIGS), copper-indium-selenium (CIS), copper-indium-gallium-sulfur-selenium (CIGSSe), copper-gallium-selenium (CGS) or other group I B, group III A and group VI A compound semiconductors, or combinations thereof. If the light-absorbing material is made of a group II B and group VI A compound semiconductor, the light-absorbing material may include cadmium-telluride (CdTe) or other group II B and group VI A compound semiconductors, or combinations thereof.

Figure 10:
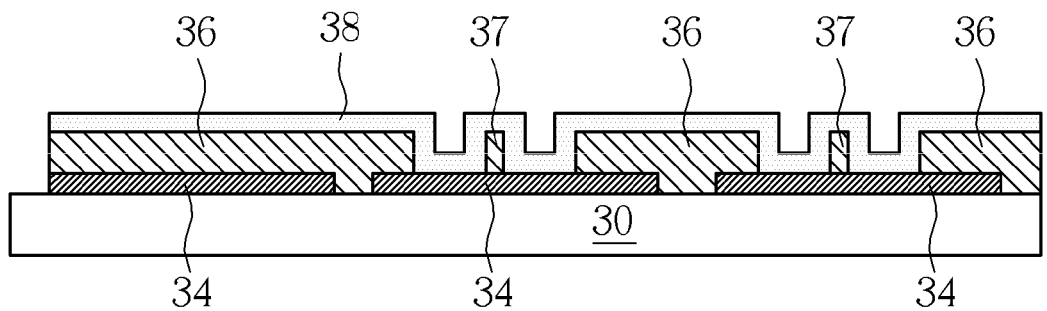

As illustrated in FIG. 10, a buffer layer 38 is then formed on the light-absorbing patterns 36 and the spacing structures 37. The buffer layer 38 covers the light-absorbing patterns 36 and the spacing structures 37. The buffer layer 38 contacts the first electrodes 34 exposed by the light-absorbing patterns 36 and the spacing structures 37, and the buffer layer 38 is electrically connected to the first electrodes 34 exposed by the light-absorbing patterns 36 and the spacing structures 37. The buffer layer 38 can be made of cadmium sulfide (CdS), zinc sulfide (ZnS), di-indium tri-sulfide ($In_2S_3$), mixtures of indium oxide, indium hydroxide and indium sulfide (In(O,OH,S)), zinc oxide (ZnO), zinc selenide (ZnSe), mixtures of zinc oxide, zinc hydroxide and zinc sulfide (Zn(O,OH,S)), zinc magnesium oxide (ZnMgO), di-indium tri-selenide ($In_2Se_3$), mixtures of indium oxide, indium hydroxide and indium selenide (In(O,OH,Se)), indium tri-hydroxide (In(OH)$_3$), zinc indium selenide (ZnInSe), tin oxide (SnO), tin disulfide ($SnS_2$) or other buffer materials, or combinations thereof.

Figure 11:
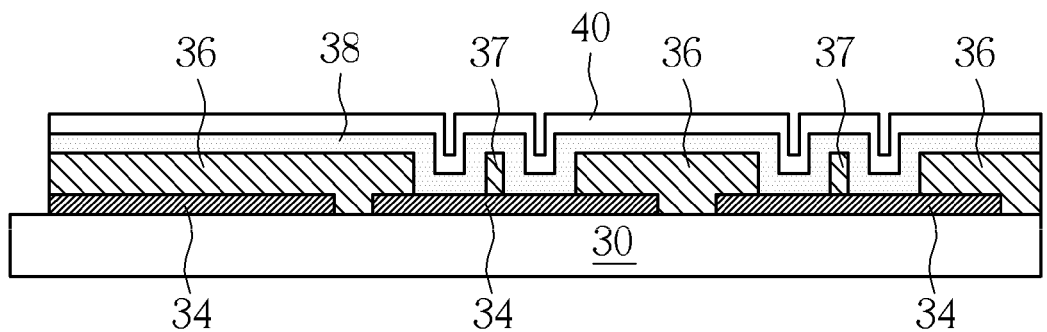

As illustrated in FIG. 11, a transparent conductive layer 40 is then formed on the buffer layer 38. The transparent conductive layer 40 in accordance to the present embodiment can be made of any transparent conductive materials of excellent electrically conductivity, e.g. undoped zinc oxide (i-ZnO), aluminum doped zinc oxide (AZO) or other transparent conductive materials, or combinations of the above materials.

Figure 12:
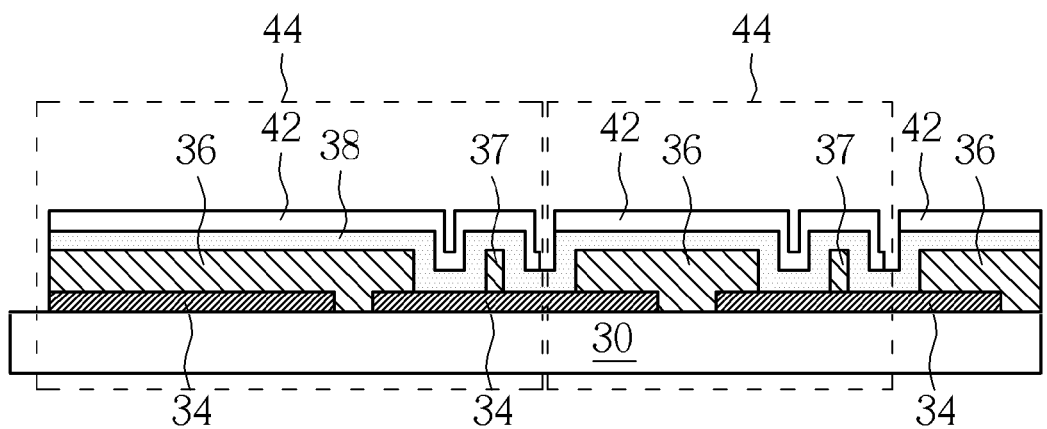

As illustrated in FIG. 12, the transparent conductive layer 40 is then patterned to form a plurality of second electrodes 42. The method in accordance to the present embodiment disposes the spacing structures 37 between two adjacent light-absorbing patterns 36, where the spacing structures 37 are disconnected from the light-absorbing patterns 36. Therefore, in the method of the present embodiment, a plurality of thin film solar cell units 44 electrically connected in series are formed after patterning the transparent conductive layer 40, without requiring removing the buffer layer 38 and the light-absorbing patterns 36 which are not covered by the second electrodes 42. Since the method in accordance to the present embodiment can form a plurality of thin film solar cell units 44 electrically connected in series after the transparent conductive layer 40 is patterned, the manufacturing process is greatly simplified. The step of patterning the transparent conductive layer 40 is preferably achieved by a laser scribing process, but is not limited. Based on different considerations, the step of patterning transparent conductive layer 40 can also be achieved by a mechanical scribing process or a photolithography process.

Figure 13:
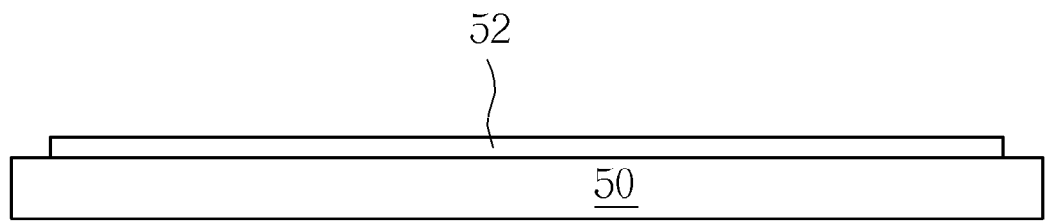
FIG. 13 to FIG. 18 are schematic diagrams illustrating a method of forming a thin film solar cell in accordance to a third preferred embodiment of the present invention.

Referring to FIG. 13 to FIG. 18, FIG. 13 to FIG. 18 are schematic diagrams illustrating a method of forming a thin film solar cell in accordance to a third preferred embodiment of the present invention. As illustrated in FIG. 13, a substrate 50 is first provided. The substrate 50 can be a plastic substrate, a glass substrate or other types of substrate made of any materials. A conductive layer 52 is then formed on the substrate 50. The light-receiving surface of the thin film solar cell in accordance to the present embodiment is the bottom side surface of FIG. 13; therefore, the conductive layer 52 can be made of any transparent conductive materials of good electrical conductivity, e.g. undoped zinc oxide (i-ZnO), aluminum doped zinc oxide (AZO), other transparent conductive materials or combinations thereof, but is not limited.

Figure 14:
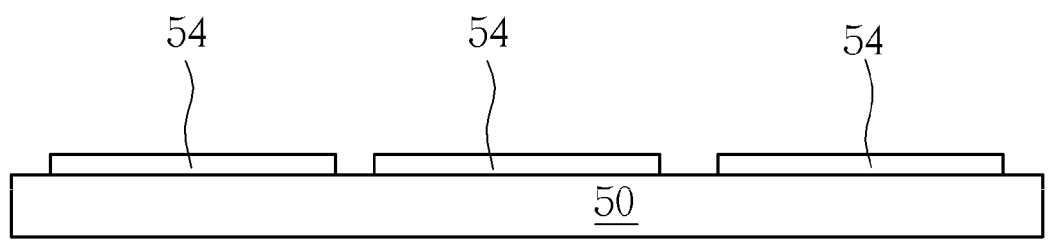

As illustrated in FIG. 14, the conductive layer 52 is then patterned to form a plurality of first electrodes 54 on the substrate 50. The step of forming the patterned first electrodes 54 in accordance to the present embodiment is preferably achieved by a laser scribing process, but is not limited. For example, the step of patterning the first electrodes 54 can also be achieved by a mechanical scribing process or a photolithography process.

Figure 15:
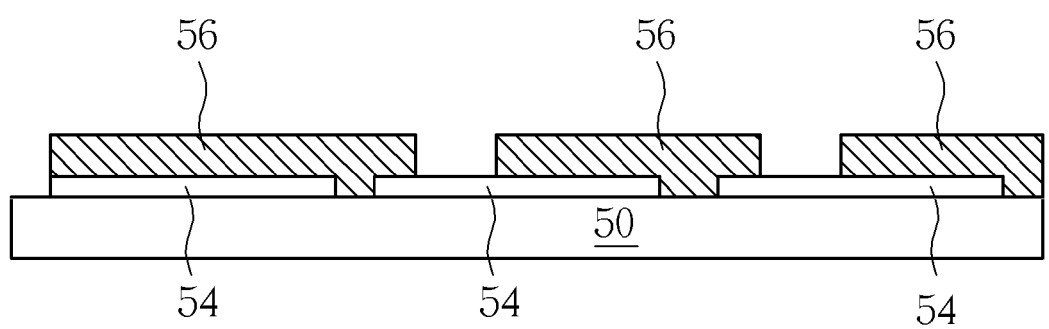

As illustrated in FIG. 15, a printing process is subsequently performed to print a light-absorbing material on the substrate 50 and the first electrodes 54 to form a plurality of light-absorbing patterns 56. Each of the light-absorbing patterns 56 substantially corresponds to the first electrodes 54 respectively, and each of the light-absorbing patterns 56 partially exposes the corresponding first electrodes 54. To be exact, each of the light-absorbing patterns 56 partially covers the two corresponding adjacent first electrodes 54 substantially, partially exposes the two corresponding adjacent first electrodes 54, and completely covers the substrate 50 between the two corresponding adjacent first electrodes 54. The printing process in accordance to the present invention can be an ink-jet printing process, a screen printing process or other kinds of printing processes. The light-absorbing material in accordance to the present embodiment includes solution-based light-absorbing materials, but is not limited. For example, the light-absorbing material can be made of amorphous silicon or other semiconductor materials. When the light-absorbing material is made of amorphous silicon, for instance, the method in accordance to the present embodiment can utilize a diffusional method to form a P-I-N structure in the light-absorbing layer, so that it is not necessary to form the buffer layer by another process.

Figure 16:
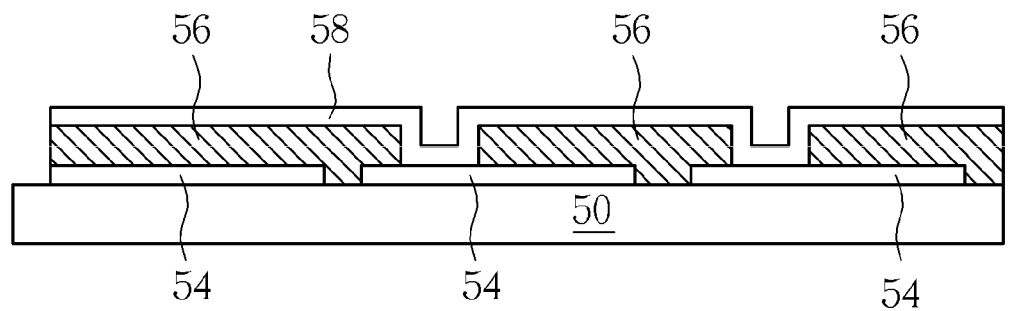

As illustrated in FIG. 16, a transparent conductive layer 58 is then formed on the light-absorbing patterns 56. The transparent conductive layer 58 may be any transparent conductive materials of excellent electrical conductivity, e.g. undoped zinc oxide (i-ZnO), aluminum doped zinc oxide (AZO) or other transparent conductive materials, or combinations thereof.

Figure 17:
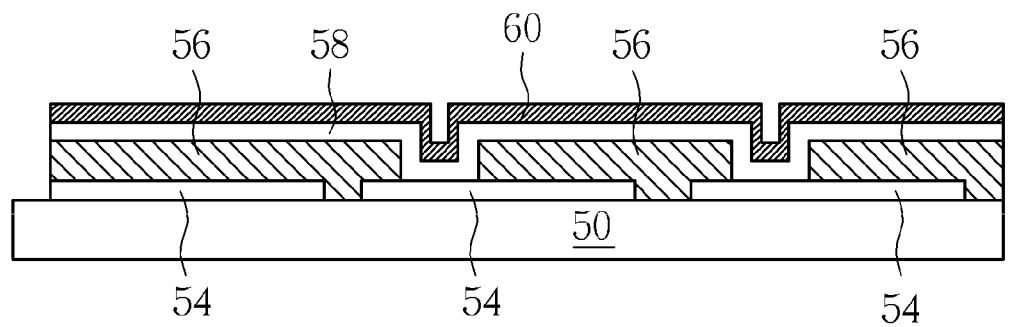

As illustrated in FIG. 17, a non-transparent conductive layer 60 is then formed on the transparent conductive layer 58. The non-transparent conductive layer 60 exhibits both excellent electrical conductivity and light reflectivity, and such materials include aluminum metal or other non-transparent conductive materials of excellent electrical conductivity and reflectivity.

Figure 18:
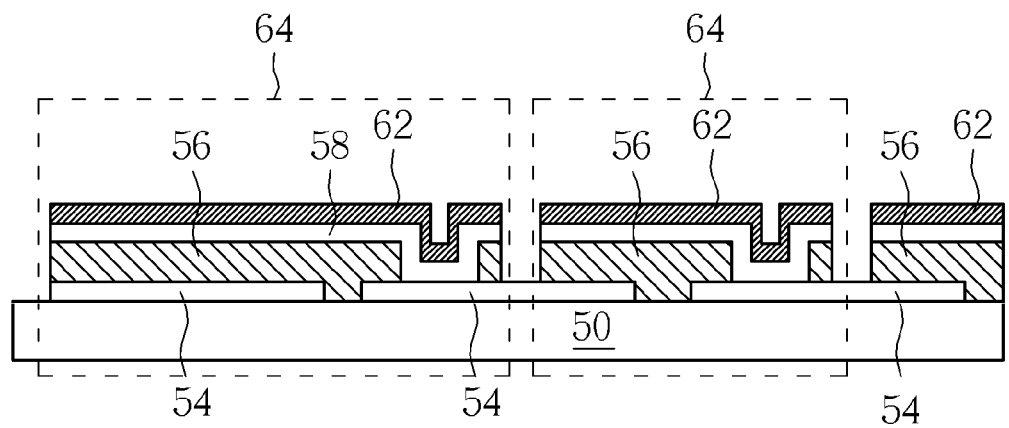

As illustrated in FIG. 18, the non-transparent conductive layer 60 and the transparent conductive layer 58 are then patterned to form a plurality of second electrodes 62. The step of patterning the non-transparent conductive layer 60 and the transparent conductive layer 58 in accordance to the present embodiment is preferably achieved by a mechanical scribing process or a laser scribing process. Also, the light-absorbing patterns 56 may be trimmed off during the mechanical scribing process or the laser scribing process to form a plurality of thin film solar cell units 64 electrically connected in series. The method in accordance to the present invention is not limited. E.g. the non-transparent conductive layer 60 and the transparent conductive layer 58 may be patterned by a photolithography process to form the second electrodes 62, and the light-absorbing patterns 56 which are not covered by the second electrodes 62 are further etched and removed to form the thin film solar cell units 64 electrically connected in series.

In summary, the method of forming the thin film solar cell in accordance to the present invention utilizes printing processes to form the light-absorbing patterns, so that the manufacturing cost and the process complexity in comparison to conventional method which uses a photolithography process to form the light-absorbing patterns, is greatly reduced and simplified, contributing to the development of the thin film solar cell.

Those skilled in the art will readily observe that numerous modifications and alterations of the device and method may be made while retaining the teachings of the invention.

What is claimed is:

1. A method of forming a thin film solar cell, comprising:
   providing a substrate;
   forming a plurality of first electrodes on the substrate, wherein the step of forming the first electrodes comprises:

forming a transparent conductive layer on the substrate; and patterning the transparent conductive layer to form the first electrodes;

performing a printing process to print a light-absorbing material on the substrate and the first electrodes to form a plurality of light-absorbing patterns, wherein each of the light-absorbing patterns corresponds to two adjacent first electrodes respectively, partially covers the two adjacent first electrodes, and partially exposes the two adjacent first electrodes; and forming a plurality of second electrodes on the light-absorbing patterns, wherein the step of forming the second electrodes comprises:

forming another transparent conductive layer and a non-transparent conductive layer on the light-absorbing patterns and the first electrodes exposed by the light-absorbing patterns; and patterning the non-transparent conductive layer and the another transparent conductive layer to form the second electrodes.

2. The method of claim 1, wherein the printing process comprises an ink-jet printing process or a screen printing process.

3. The method of claim 1, further comprising forming a buffer layer on the light-absorbing patterns before forming the second electrodes, the buffer layer being electrically connected to the first electrodes exposed by the light-absorbing patterns.

4. The method of claim 3, wherein the step of performing the printing process further comprises forming a plurality of spacing structures on the first electrodes.

5. The method of claim 4, wherein each of the spacing structures is disposed between two adjacent light-absorbing patterns and each of the spacing structures is disconnected from the light-absorbing patterns.

6. The method of claim 5, wherein the buffer layer further covers the spacing structures.

7. The method of claim 3, wherein the light-absorbing material comprises a group I B, group III A and group VI A compound semiconductor or a group II B and group VI A compound semiconductor.

8. The method of claim 7, wherein the group I B, group III A and group VI A compound semiconductor comprises copper-indium-gallium-selenium (CIGS), copper-indium-selenium (CIS), copper-indium-gallium-sulfur-selenium (CIGSSe) or copper-gallium-selenium (CGS).

9. The method of claim 7, wherein the group II B and group VI A compound semiconductor comprises cadmium-telluride (CdTe).

10. The method of claim 1, wherein the light-absorbing material comprises amorphous silicon.

11. The method of claim 1, wherein the light-absorbing material comprises solution-based light-absorbing materials.

12. The method of claim 1, wherein the light-absorbing patterns remain on the substrate and the first electrodes after the second electrodes are formed.

* * * * *